(12) United States Patent
Gozu et al.

(10) Patent No.: US 9,961,760 B2
(45) Date of Patent: May 1, 2018

(54) WIRING SUBSTRATE

(71) Applicant: SHINKO ELECTRIC INDUSTRIES CO., LTD., Nagano (JP)

(72) Inventors: Yusuke Gozu, Nagano (JP); Yuta Sakaguchi, Nagano (JP); Noriyoshi Shimizu, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days. days.

(21) Appl. No.: 15/489,876

(22) Filed: Apr. 18, 2017

(65) Prior Publication Data

US 2017/0359891 A1 Dec. 14, 2017

(30) Foreign Application Priority Data

Jun. 13, 2016 (JP) .................. 2016-117070

(51) Int. Cl.
*H05K 1/02* (2006.01)
*H05K 1/03* (2006.01)
*H01L 23/498* (2006.01)
*H01L 21/48* (2006.01)

(52) U.S. Cl.
CPC ....... *H05K 1/0213* (2013.01); *H01L 21/4857* (2013.01); *H01L 23/49822* (2013.01); *H01L 23/49838* (2013.01); *H01L 23/49894* (2013.01); *H05K 1/0353* (2013.01); *H01L 21/486* (2013.01); *H01L 23/49827* (2013.01)

(58) Field of Classification Search
CPC ... H05K 1/0213; H05K 1/0313; H05K 1/0353
See application file for complete search history.

(56) References Cited

U.S. PATENT DOCUMENTS 6,613,986 B1 * 9/2003 Hirose ................ H05K 1/0224
174/255
9,711,439 B2 7/2017 Sakamoto et al.

FOREIGN PATENT DOCUMENTS

| JP | H01-207989 | 8/1989 |
| JP | 2004-259774 | 9/2004 |
| JP | 2007-266316 | 10/2007 |
| JP | 2013-048197 | 3/2013 |

OTHER PUBLICATIONS

Office Action dated Dec. 5, 2017 issued with respect to the basic Japanese Patent Application No. 2016-117070.

* cited by examiner

*Primary Examiner* — Timothy Thompson
*Assistant Examiner* — Amol Patel
(74) *Attorney, Agent, or Firm* — IPUSA, PLLC

(57) ABSTRACT

A wiring substrate includes an insulating layer including a projection and a wiring layer on the projection. The wiring layer includes a first metal layer on an end face of the projection and a second metal layer on the first metal layer. The width of the end face of the projection is different from at least one of the width of the first metal layer and the width of the second metal layer. An inner wall surface and a bottom surface of a depression around the projection are roughened surfaces.

9 Claims, 13 Drawing Sheets

WIRING SUBSTRATE

CROSS-REFERENCE TO RELATED APPLICATION

This application is based upon and claims the benefit of priority of the prior Japanese Patent Application No. 2016-117070, filed on Jun. 13, 2016, the entire contents of which are incorporated herein by reference.

FIELD

A certain aspect of the embodiments discussed herein is related to wiring substrates.

BACKGROUND

There is a demand for an increase in the wiring density of a wiring layer in wiring substrates on which semiconductor chips are mountable. For example, a semi-additive process is used to form a high-density wiring layer. When wiring layers become higher in wiring density to reduce the interval between wiring patterns, there arises concern about a decrease in insulation reliability due to, for example, the occurrence of ion migration. Various measures have been taken to address such concern.

For example, to remove metal residues between wiring patterns considered as the cause of the occurrence of ion migration, the technique of removing a substrate surface between wiring patterns by etching is proposed. According to this technique, a depression is formed between wiring patterns by etching. (See, for example, Japanese Laid-open Patent Publication No. 2004-259774.)

SUMMARY

According to an aspect of the embodiments, a wiring substrate includes an insulating layer including a projection and a wiring layer on the projection. The wiring layer includes a first metal layer on an end face of the projection and a second metal layer on the first metal layer. The width of the end face of the projection is different from at least one of the width of the first metal layer and the width of the second metal layer. An inner wall surface and a bottom surface of a depression around the projection are roughened surfaces.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
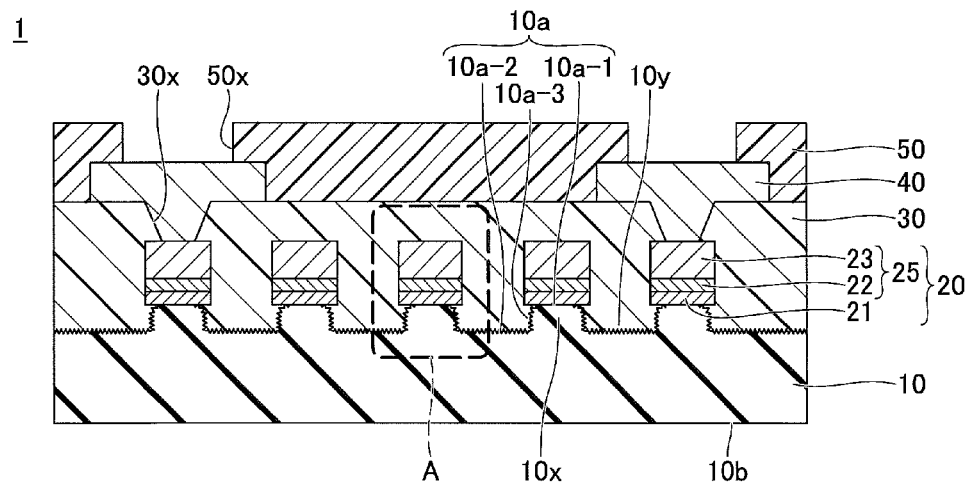
FIGS. 1A and 1B are cross-sectional views of a wiring substrate according to a first embodiment.

As described above, various measures have been taken to address concern about a decrease in insulation reliability. In order to accommodate a further increase in the wiring density of a wiring layer, however, more effective measures for the prevention of a decrease in insulation reliability are desired.

According to an aspect of the present invention, a wiring substrate in which the wiring density of a wiring layer is increased without a decrease in insulation reliability is provided.

Preferred embodiments of the present invention will be explained with reference to accompanying drawings. In the following description, the same elements are referred to using the same reference numeral, and a repetitive description thereof may be omitted.

[a] First Embodiment

[Structure of Wiring Substrate]

Figure 1B:
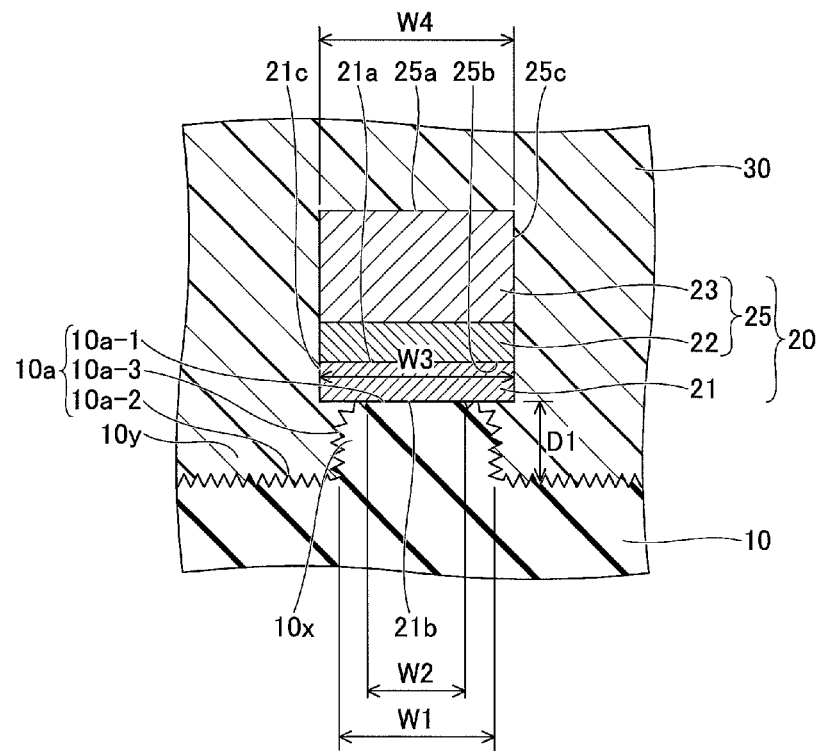

FIG. 1A is a cross-sectional view of part of a wiring substrate in which wiring layers and insulating layers are alternately stacked according to a first embodiment. FIG. 1B is an enlarged view of part A indicated by the dashed line in FIG. 1A.

Referring to FIG. 1A, a wiring substrate 1 includes an insulating layer 10, a wiring layer 20, an insulating layer 30, a wiring layer 40, and a protective insulating layer 50.

According to this embodiment, for convenience of description, the protective insulating layer 50 side of the wiring substrate 1 will be referred to as "upper side" or "first side," and the insulating layer 10 side of the wiring substrate 1 will be referred to as "lower side" or "second side." Furthermore, with respect to each part or element of the wiring substrate 1, a surface on the protective insulating layer 50 side will be referred to as "upper surface" or "first surface," and a surface on the insulating layer 10 side will be referred to as "lower surface" or "second surface." The wiring substrate 1, however, may be used in an inverted position or oriented at any angle. Furthermore, a plan view refers to a view of an object taken in a direction normal to an upper end face 10a-1 of each of projections 10x of the insulating layer 10, and a planar shape refers to the shape of an object viewed in a direction normal to the upper end face 10a-1 of each of the projections 10x of the insulating layer 10.

The insulating layer 10 is, for example, an insulating layer to serve as an interlayer insulating layer in multilayer wiring to allow formation of multilayer wiring using a build-up process. As the insulating layer 10, for example, an insulating resin having glass cloth impregnated with a thermosetting insulating resin such as an epoxy resin may be used. An insulating resin having a woven or non-woven fabric of glass fibers, carbon fibers, or aramid fibers impregnated with a thermosetting insulating resin such as an epoxy resin may also be used as the insulating layer 10. When formed of a thermosetting insulating resin, the insulating layer 10 may have a thickness of, for example, approximately 10 μm to approximately 1000 μm.

Alternatively, for example, a photosensitive insulating resin such as a phenolic resin or a polyimide resin may be used as the material of the insulating layer 10. When formed of a photosensitive insulating resin, the insulating layer 10 may have a thickness of, for example, approximately 5 μm to approximately 10 μm. The insulating layer 10 may contain a filler such as silica or alumina on an as-needed basis while containing a photosensitive insulating resin as a principal component.

The insulating layer 10 includes an upper surface 10a and a lower surface 10b. Although not depicted, the lower surface 10b covers an insulating layer and a wiring layer under the insulating layer 10, and the insulating layer 10 includes via interconnects for electrically connecting the wiring layer 20 and the wiring layer under the insulating layer 10.

The insulating layer 10 includes projections 10x and depressions 10y formed in the upper surface 10a. Specifically, of the upper surface 10a of the insulating layer 10, a region on which the wiring layer 20 is formed is on the projections 10x and the other region is in the depressions 10y. That is, the upper surface 10a positioned (exposed) outside the wiring layer 20 (between adjacent patterns of the wiring layer 20) is dug in (depressed) toward the lower surface 10b to form the depressions 10y.

In the upper surface 10a, a surface of each projection 10x on its first side is referred to as "upper end face 10a-1" (end face) and a surface of each depression 10y on its second side is referred to as "bottom surface 10a-2". Furthermore, the sidewall surfaces of the projections 10x also serve as inner wall surfaces 10a-3 of the depressions 10y. That is, the sidewall surfaces of the projections 10x and the inner wall surfaces 10a-3 of the depressions 10y have the same configuration, and the projections 10x and the depressions 10y are continuously provided. For convenience of description, the sidewall surfaces of the projections 10x and the inner wall surfaces 10a-3 of the depressions 10y may be described with the inner wall surfaces 10a-3 of the depressions 10y serving as a viewpoint. Hereinafter, the projections 10x are collectively referred to as "projection 10x" where a description is common to the projections 10x, and the depressions 10y are collectively referred to as "depression 10y" where a description is common to the depressions 10y.

The bottom surface 10a-2 of the depression 10y is positioned lower (closer to the lower surface 10b) than the upper end face 10a-1 of the projection 10x. The upper end face 10a-1 of the projection 10x is a smooth surface. A surface roughness Ra of the upper end face 10a-1 of the projection 10x may be, for example, approximately 3 nm to approximately 20 nm. In contrast, the bottom surface 10a-2 and the inner wall surfaces 10a-3 of the depression 10y are roughened surfaces. A surface roughness Ra of the bottom surface 10a-2 and the inner wall surfaces 10a-3 of the depression 10y may be, for example, approximately 50 nm to approximately 100 nm. Thus, the bottom surface 10a-2 and the inner wall surfaces 10a-3 of the depression 10y have a higher surface roughness than the upper end face 10a-1 of the projection 10x.

As described below, a metal film (metal layer) 21 is formed on the upper end face 10a-1 of the projection 10x. On the metal film 21 side, the depression 10y becomes wider, namely, the distance between the inner wall surfaces 10a-3 of the depression 10y increases, as the depression 10y approaches the metal film 21. In other words, on the metal film 21 side, the projection 10x surrounded by the depression 10y becomes narrower, namely, the distance between the sidewall surfaces of the projection 10x decreases, as the projection 10x approaches the metal film 21. That is, a width W2 of the upper end face 10a-1 of the projection 10x (the width of the interface between the insulating layer 10 and the metal film 21) is smaller than a width W1 of a portion of the projection 10x not reduced in width (a second-side portion of the projection 10x on the opposite side from the metal film 21). The width W2 of the upper end face 10a-1 of the projection 10x may be, for example, approximately 2 μm to approximately 5 μm. A depth D1 of the depressions 10y may be, for example, approximately 0.5 μm to approximately 2 μm.

The wiring layer 20 is formed on the upper end face 10a-1 of the projection 10x of the insulating layer 10. The wiring layer 20 includes the metal film 21 and a metal layer 25. The wiring layer 20 is a fine-line wiring layer (a wiring layer including high-density wiring patterns). Here, the fine-line wiring layer refers to a wiring layer whose line/space is 10 μm/10 μm or less. The line/space of the wiring layer 20 may be, for example, approximately 2 μm/2 μm to approximately 5 μm/5 μm. The thickness of the wiring layer 20 (the total thickness between the lower surface of the metal film 21 and the upper surface of the metal layer 25) may be, for example, approximately 1 μm to approximately 3 μm.

The "line" in "line/space" represents the width of a wiring pattern, and the "space" in "line/space" represents the interval between adjacent wiring patterns (wiring interval). For example, when the line/space is described as 10 μm/10 μm, this line/space indicates that the width of a wiring pattern is 10 μm and the wiring interval is 10 μm.

The metal film (metal layer) 21 includes an upper surface 21a, a lower surface 21b, and side surfaces 21c. The metal film 21 is formed on the upper end face 10a-1 of the projection 10x to expose a peripheral portion of the lower surface 21b outside the upper end face 10a-1. The metal film 21 is formed of a metal more adhesive to the insulating layer 10 than is the metal layer 25. The metal film 21 is a so-called adhesion layer. When the material of the metal layer 25 is copper (Cu), for example, titanium, nickel, or chromium may be used as the material of the metal film 21. The thickness of the metal film 21 may be, for example, approximately 20 nm to approximately 100 nm. A width W3 of the metal film 21 is greater than the width W2 of the upper end face 10a-1 by, for example, approximately 0.1 μm to approximately 0.3 μm. The width W3 of the metal film 21 is greater than the width W1 of the projection 10x.

The metal layer 25 is stacked on the metal film 21. Specifically, the metal layer 25 includes a metal film 22 and a metal film 23. The metal film 22 is formed on the upper surface 21a of the metal film 21. The metal film 22 is a so-called seed layer for forming the metal film 23.

The metal film 23 is stacked on the metal film 22. Suitable materials for the metal film 22 and the metal film 23 include, for example, copper. The thickness of the metal film 22 may be, for example, approximately 100 nm to approximately 500 nm. The thickness of the metal film 23 may be, for example, approximately 1 μm to approximately 6 μm.

The metal layer 25 includes an upper surface 25a, a lower surface 25b, and side surfaces 25c. A width W4 of the metal layer 25 (the metal film 22 and the metal film 23) is substantially equal to the width W3 of the metal film 21. Furthermore, the width W4 of the metal layer 25 is greater than the width W1 of the projection 10x.

The insulating layer 30 is formed on the insulating layer 10 to cover the wiring layer 20 and fill in the depression 10y. For example, the material of the insulating layer 30 may be the same as the material of the insulating layer 10. The insulating layer 30 may be formed on the insulating layer 10, using either the same material as or a material different from the material of the insulating layer 10. Multiple wiring layers 20 and multiple insulating layers 30 may be alternately stacked on the insulating layer 10. In this case, the wiring layer 40 is formed on the uppermost insulating layer 30.

The wiring layer 40 is formed on the upper surface of the insulating layer 30, and is electrically connected to the wiring layer 20 via an adhesion layer and a seed layer (not depicted). The wiring layer 40 includes via interconnects filling in via holes 30x piercing through the insulating layer 30 to expose the upper surface of the wiring layer 20 and wiring patterns formed on the upper surface of the insulating layer 30. Suitable materials for the wiring layer 40 include, for example, copper. The wiring patterns of the wiring layer 40 are metal posts or pads projecting from the upper surface of the insulating layer 30. The wiring layer 40 may include routing wiring patterns that interconnect metal posts or pads on the upper surface of the insulating layer 30 on an as-needed basis. The wiring layer 40 may project from the upper surface of the insulating layer 30 by, for example, approximately 1 μm to approximately 10 μm.

The protective insulating layer 50 is faulted on the insulating layer 30 to cover the wiring layer 40. Suitable materials for the protective insulating layer 50 include, for example, photosensitive insulating resins whose principal component is a phenolic resin or a polyimide resin. The protective insulating layer 50 may contain a filler such as silica or alumina on an as-needed basis while containing a photosensitive insulating resin as a principal component. The thickness of the protective insulating layer 50 may be, for example, approximately 5 μm to approximately 30 μm.

The protective insulating layer 50 includes openings 50x. Part of the wiring layer 40 is exposed at the bottom of the openings 50x. The part of the wiring layer 40 exposed at the bottom of the openings 50x serves as, for example, pads to be electrically connected to a semiconductor chip or the like. When the wiring patterns of the wiring layer 40 are metal posts, the protective insulating layer 50 may be formed to cover the side surfaces of the metal posts. The protective insulating layer 50 is optional and may be omitted.

A surface treatment layer (not depicted) may be formed on the upper surface (upper surface alone or upper and side surfaces in the case of metal posts) of the wiring layer 40 exposed at the bottom of the openings 50x. Examples of surface treatment layers include a gold (Au) layer, a Ni/Au layer (a laminated metal layer of a Ni layer and a Au layer that are stacked in this order), and a Ni/Pd/Au layer (a laminated metal layer of a Ni layer, a palladium [Pd] layer, and a Au layer that are stacked in this order). An antioxidation treatment such as an organic solderability preservative (OSP) process may be performed on the upper surface of the wiring layer 40 exposed at the bottom of the openings 50x to form a surface treatment layer.

[Method of Manufacturing Wiring Substrate]

Next, a method of manufacturing a wiring substrate according to the first embodiment is described. FIGS. 2A through 2I are diagrams depicting a process of manufacturing a wiring substrate according to the first embodiment. According to the process illustrated below, a single wiring substrate is manufactured. The process, however, may be adapted to manufacture a structure to become multiple wiring substrates and thereafter divide the structure into individual wiring substrates.

Figure 2A:
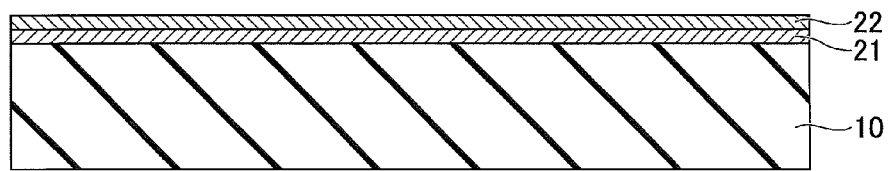
FIGS. 2A through 2I are diagrams depicting a process of manufacturing a wiring substrate according to the first embodiment.

First, in the process depicted in FIG. 2A, the insulating layer 10 is prepared, and the metal film 21 and the metal film 22 are successively stacked on the first surface of the insulating layer 10 by, for example, sputtering or electroless plating. The material, thickness, etc., of the insulating layer 10 are as described above.

While suitable materials for the metal film 21 include, for example, titanium, nickel, and chromium, titanium is used as the material of the metal film 21 in the illustrated case. The thickness of the metal film 21 may be, for example, approximately 20 nm to approximately 100 nm. Suitable materials for the metal film 22 include, for example, copper. The thickness of the metal film 22 may be, for example, approximately 100 nm to approximately 500 nm. The metal film 21 is an adhesion layer provided to increase the adhesion between the insulating layer 10 and the metal layer 25. The metal film 22 is a seed layer for forming the metal film 23.

Figure 2B:
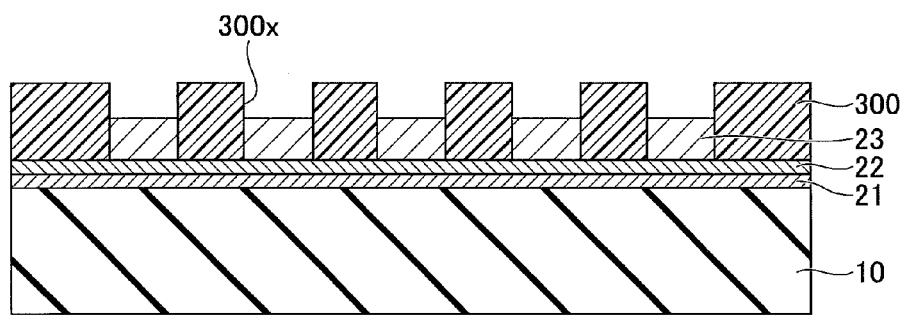

Next, in the process depicted in FIG. 2B, a resist layer 300 (such as a dry film resist) having openings 300x is formed on the upper surface of the metal film 22 (in a region where the wiring layer 20 is to be formed). The metal film 23 of, for example, copper is formed on the metal film 22 exposed in the openings 300x by electroplating, using the metal film 22 as a power feed layer. The thickness of the metal film 23 may be, for example, approximately 1 μm to approximately 6 μm.

Figure 2C:
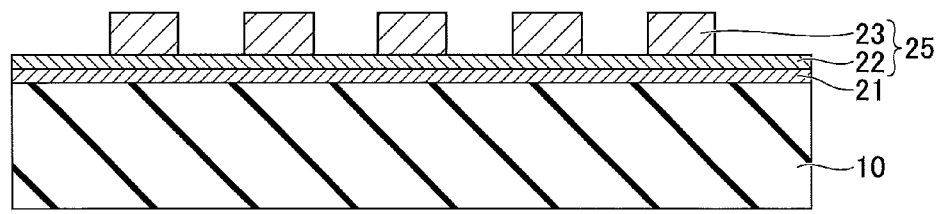
Figure 2D:
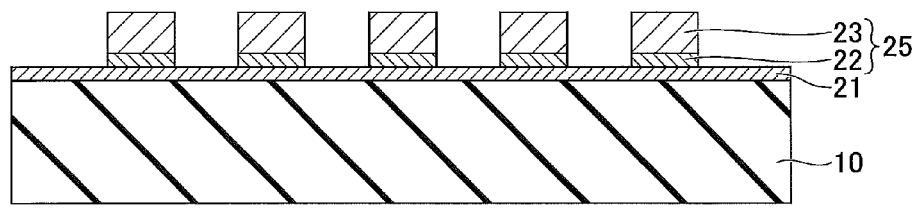

Next, in the process depicted in FIG. 2C, the resist layer 300 is removed using a stripper, and in the process depicted in FIG. 2D, an exposed part of the metal film 22 not covered with the metal film 23 is removed by, for example, wet etching, using the metal film 23 as a mask. When the metal film 22 is formed of copper, the exposed part of the metal film 22 may be removed, using, for example, an acid aqueous solution of oxidizing liquid. As a result of the process depicted in FIG. 2D, the metal layer 25 including the metal film 22 and the metal film 23 is formed.

Figure 2E:
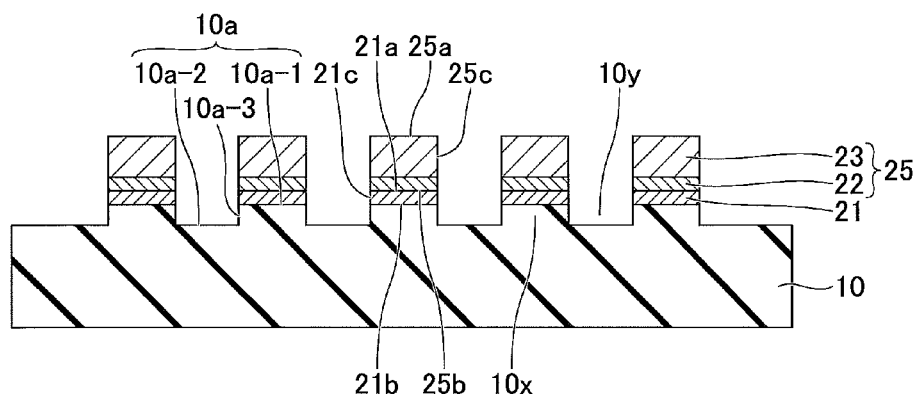

Next, in the process depicted in FIG. 2E, the metal film 21 exposed through the metal layer 25 (the metal films 22 and 23) is removed. Furthermore, the upper surface 10a of the insulating layer 10 exposed by the removal of the metal film 21 is cut (dug) into to form the depression 10y around a laminate of the metal film 21 and the metal layer 25.

In other words, as a result of cutting (digging) into the upper surface 10a of the insulating layer 10 exposed by the removal of the metal film 21, a region of the insulating layer 10 on which a laminate of the metal film 21 and the metal layer 25 is formed projects to form the projection 10x. That is, part of the upper surface 10a of the insulating layer 10 on which the metal film 21 and the metal layer 25 are formed becomes the projection 10x, and the rest of the upper surface 10a of the insulating layer 10 becomes the depression 10y. The upper surface 10a of the insulating layer 10 includes the upper end face 10a-1 of the projection 10x and the bottom surface 10a-2 of the depression 10y.

The metal film 21 of titanium and the insulating layer 10 may be removed by, for example, a series of processes of anisotropic etching. Examples of anisotropic etching include reactive ion etching (RIE) using gas such as $CF_4$ or $SF_6$.

Figure 2F:
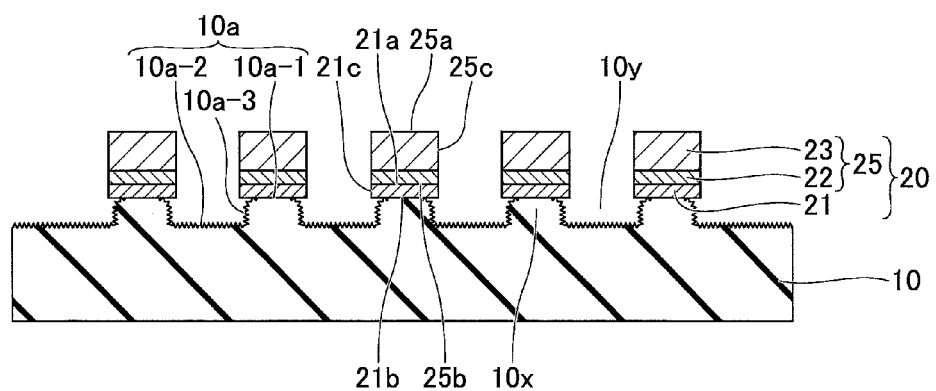

Next, in the process depicted in FIG. 2F, the insulating layer 10 is further removed on the bottom surface side and the inner wall surface 10a-3 side of the depression 10y to make the depression 10y deeper and make the width W1 of the projection 10x or the width W2 of the upper end face 10a-1 smaller than the width W3 of the metal film 21 and the width W4 of the metal layer 25 (see FIG. 1B). At this point, on the metal film 21 side, the distance between the inner wall surfaces 10a-3 of the depression 10y increases as the depression 10y approaches the metal film 21. In other words, on the metal film 21 side (the upper end face 10a-1 side), the projection 10x surrounded by the depression 10y becomes narrower as the projection 10x approaches the metal film 21. Whether to increase the distance between the inner wall surfaces 10a-3 of the depression 10y on the metal film 21 side, however, may be determined as desired by changing etching conditions. For example, the inner wall surfaces 10a-3 of the depression 10y may be substantially perpendicular to the bottom surface 10a-2 of the depression 10y.

The depression 10y may be formed by, for example, isotropic etching. Examples of isotropic etching include plasma processing using gas such as $O_2$ or $N_2$. The bottom surface 10a-2 and the inner wall surfaces 10a-3 of the depression 10y are roughened by isotropic etching such as plasma processing. The surface roughness Ra of the bottom surface 10a-2 and the inner wall surfaces 10a-3 of the depression 10y may be, for example, approximately 50 nm to approximately 100 nm.

Figure 2G:
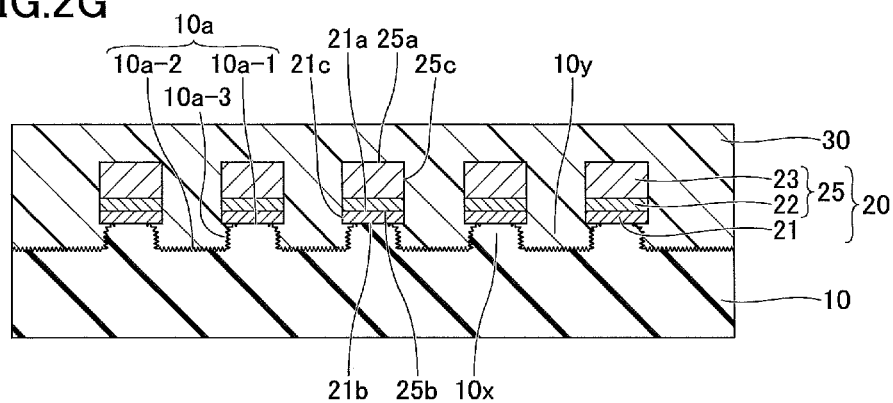

Next, in the process depicted in FIG. 2G, the insulating layer 30 is formed on the insulating layer 10 to cover the wiring layer 20 and fill in the depression 10y. The material and thickness of the insulating layer 30 are as described above. For example, a liquid or paste resin is used as the material of the insulating layer 30, and the liquid or paste resin is applied onto the insulating layer 10 by, for example, spin coating to cover the wiring layer 20 and fill in the depression 10y, and is hardened.

Figure 2H:
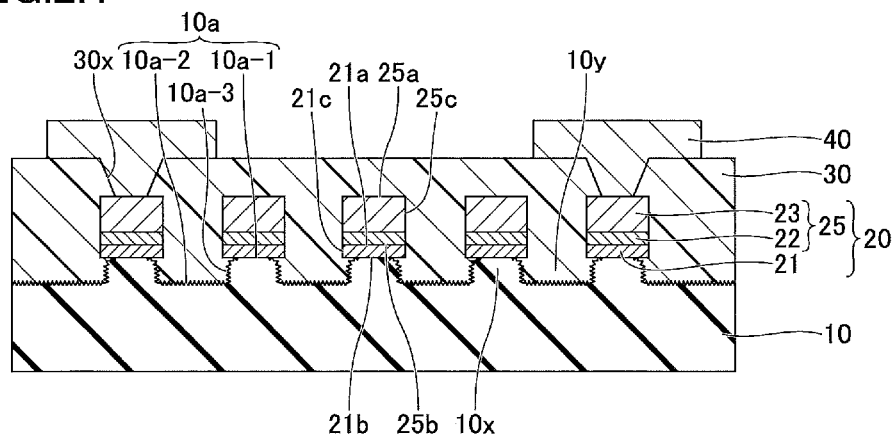

Next, in the process depicted in FIG. 2H, the insulating layer 30 is exposed to light and developed, or is subjected to laser processing, to form the via holes 30x piercing through the insulating layer 30 to expose the upper surface of the wiring layer 20. Then, the wiring layer 40 is formed on the insulating layer 30. The wiring layer 40 may be formed, using, for example, a semi-additive process. Specifically, first, an adhesion layer and a seed layer are formed by sputtering or electroless plating to continuously cover the upper surface of the insulating layer 30, the inner wall surfaces of the via holes 30x, and the upper surface of the wiring layer 20 exposed at the bottom of the via holes 30x. The same material as the metal film 21 may be used for the adhesion layer, and the same material as the metal film 22 may be used for the seed layer. The adhesion layer has the same thickness as the metal film 21, and the seed layer has the same thickness as the metal film 22.

Next, a photosensitive resist is applied onto the adhesion layer and the seed layer and is exposed to light and developed to form a resist layer having openings corresponding to the wiring layer 40. Next, an electroplating layer of, for example, copper is formed in the openings of the resist layer by electroplating, using the seed layer as a power feed layer. Next, the resist layer is removed, and thereafter, part of the adhesion layer and the seed layer not covered with the electroplating layer is removed by etching, using the electroplating layer as a mask. As a result, the wiring layer 40 having the electroplating layer stacked on the adhesion layer and the seed layer is formed.

Figure 2I:
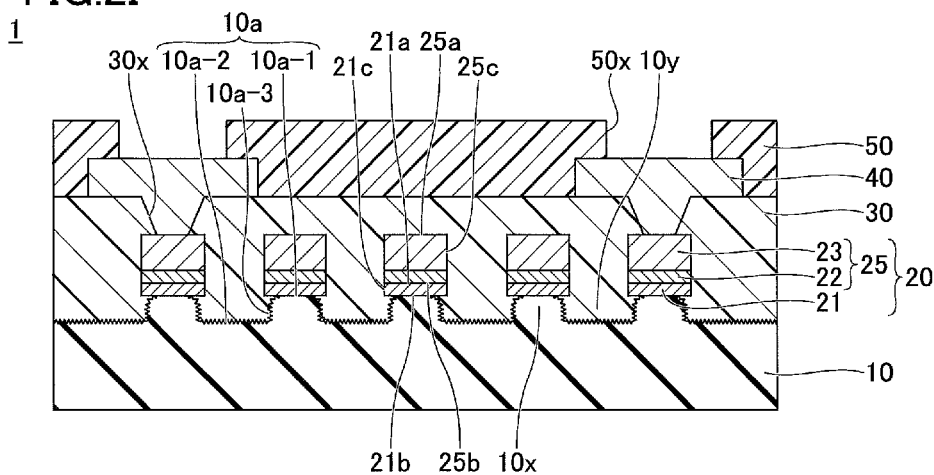

Next, in the process depicted in FIG. 2I, the protective insulating layer 50 is formed on the insulating layer 30 to cover the wiring layer 40. The protective insulating layer 50 may be formed of a photosensitive insulating resin the same as the insulating layer 30. Next, the protective insulating layer 50 is exposed to light and developed to form the openings 50x. Part of the wiring layer 40 is exposed at the bottom of the openings 50x. The above-described surface treatment layer may be formed on the upper surface of the wiring layer 40 exposed at the bottom of the openings 50x by electroless plating or an OSP process. Thereby, the wiring substrate 1 depicted in FIGS. 1A and 1B is completed.

Thus, according to the wiring substrate 1, the bottom surface 10a-2 and the inner wall surfaces 10a-3 of the depression 10y of the insulating layer 10 are roughened surfaces. This increases the adhesion between the insulating layer 10 and the insulating layer 30. Therefore, the metal films 22 and 23 are prevented from depositing at the interface between the insulating layer 10 and the insulating layer 30 to increase insulation reliability. The increase of insulation reliability is also described with reference to Example 1 described below.

Furthermore, according to the wiring substrate 1, the width W2 of the upper end face 10a-1 of the projection 10x is smaller than the width W3 of the metal film 21 and the width W4 of the metal layer 25. As a result, the distance from the wiring layer 20 (the metal layer 25 in particular) to the interface between the insulating layer 10 and the insulating layer 30 increases, thus producing the effect that dendrites or the like are less likely to be generated at the interface between the insulating layer 10 and the insulating layer 30. Because it is possible to reduce generation of dendrites that cause ion migration, it is possible to prevent the occurrence of ion migration.

First Variation of First Embodiment

A first variation of the first embodiment is directed to a fine-line wiring layer different in structure than in the first embodiment. In the description of the first variation of the first embodiment, a description of the same elements as those of the above-described embodiment may be omitted.

Figure 3A:
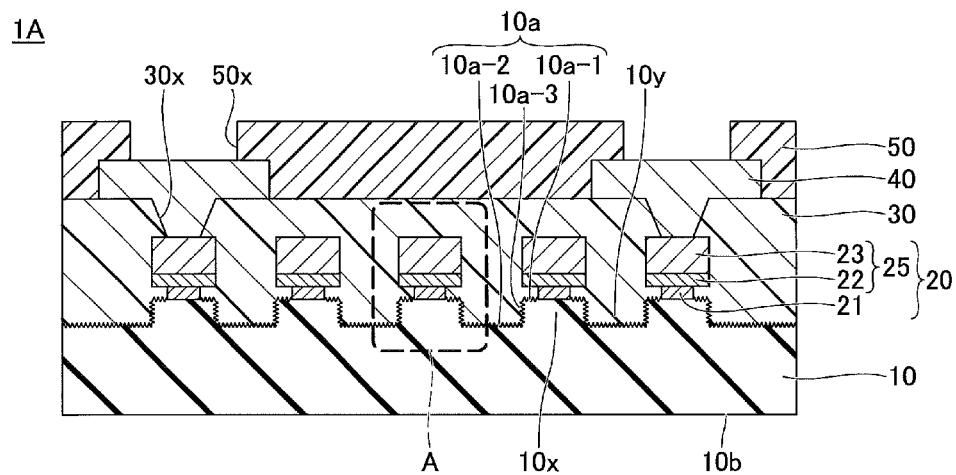
FIGS. 3A and 3B are cross-sectional views of a wiring substrate according to a first variation of the first embodiment.
Figure 3B:
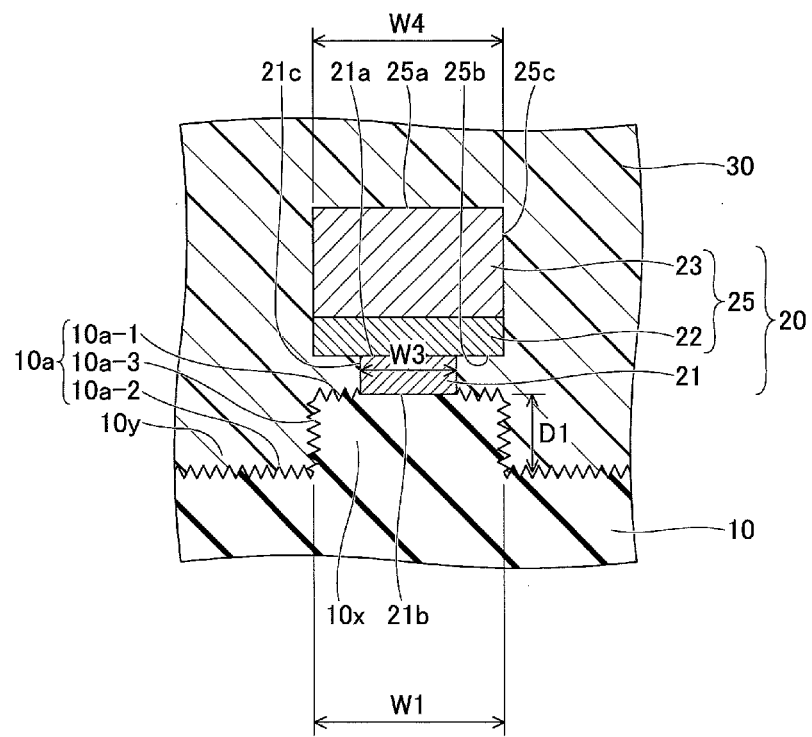

FIG. 3A is a cross-sectional view of part of a wiring substrate in which wiring layers and insulating layers are alternately stacked according to the first variation of the first embodiment. FIG. 3B is an enlarged view of part A indicated by the dashed line in FIG. 3A.

Referring to FIGS. 3A and 3B, a wiring substrate 1A is equal to the wiring substrate 1 in that the bottom surface 10a-2 and the inner wall surfaces 10a-3 of the depression 10y are roughened surfaces, but is different from the wiring substrate 1 in that there is no increase in the distance between the inner wall surfaces 10a-3 of the depression 10y. In other words, the width W1 of the projection 10x surrounded by the depression 10y is substantially constant, and is substantially equal to the width of the upper end face 10a-1 of the projection 10x. The width W1 of the projection 10x surrounded by the depression 10y (the width of the upper end face 10a-1 of the projection 10x) may be, for example, approximately 2 μm to approximately 5 μm.

The metal film 21 includes the upper surface 21a, the lower surface 21b, and the side surfaces 21c. The metal film 21 is formed on the upper end face 10a-1 of the projection 10x except for a peripheral portion of the upper end face 10a-1. In other words, the metal film 21 is formed to expose the peripheral portion of the upper end face 10a-1 of the projection 10x. Specifically, the upper surface 21a contacts the lower surface 25b of the metal layer 25 except for a peripheral portion of the lower surface 25b (namely, the upper surface 21a contacts the region of the lower surface 25b within its peripheral portion). The lower surface 21b contacts the upper end face 10a-1 of the projection 10x except for its peripheral portion (namely, the lower surface 21b contacts the region of the upper end face 10a-1 within its peripheral portion). The side surfaces 21c contact the insulating layer 30.

The width W3 of the metal film 21 is smaller than the width W1 of the upper end face 10a-1 by, for example, approximately 0.2 μm to approximately 0.4 μm. In other words, the peripheral portion of the upper end face 10a-1 of the projection 10x is, for example, an exposed region (not covered with the metal film 21) laterally extending approximately 0.1 μm to approximately 0.2 μm around the metal film 21. The peripheral portion of the upper end face 10a-1 of the projection 10x exposed around the metal film 21 is roughened to the same extent as the bottom surface 10a-2 and the inner wall surfaces 10a-3 of the depression 10y.

The upper end face 10a-1 of the projection 10x contacting the metal film 21 is a smooth surface having a smaller roughness than the bottom surface 10a-2 and the inner wall surfaces 10a-3 of the depression 10y. The side surfaces 21c of the metal film 21 are depressed toward the center relative to the side surfaces 25c of the metal layer 25 (the side surfaces of the metal film 22 and the metal film 23) and the inner wall surfaces 10a-3 of the depression 10y of the insulating layer 10.

The metal layer 25 is stacked on the upper surface 21a of the metal film 21. Specifically, the metal layer 25 includes the metal film 22 and the metal film 23. The metal film 22 is formed on the upper surface 21a of the metal film 21 with a peripheral portion of the lower surface of the metal film 22 being exposed (not covered with the metal film 21) outside the upper surface 21a of the metal film 21. The metal film 23 is stacked on the metal film 22.

The metal layer 25 includes the upper surface 25a, the lower surface 25b, and the side surfaces 25c. The metal layer 25 is formed on the metal film 21 with a peripheral portion of the lower surface 25b (the peripheral portion of the lower surface of the metal film 22) being exposed (not covered with the metal film 21) outside the upper surface 21a of the metal film 21. Furthermore, the width W4 of the metal layer 25 is greater than the width W1 of the upper end face 10a-1 of the projection 10x. Specifically, the width W4 of the metal layer 25 is greater than the width W1 of the upper end face 10a-1 of the projection 10x by, for example, approximately 0.1 μm to approximately 0.3 μm.

Figure 4:
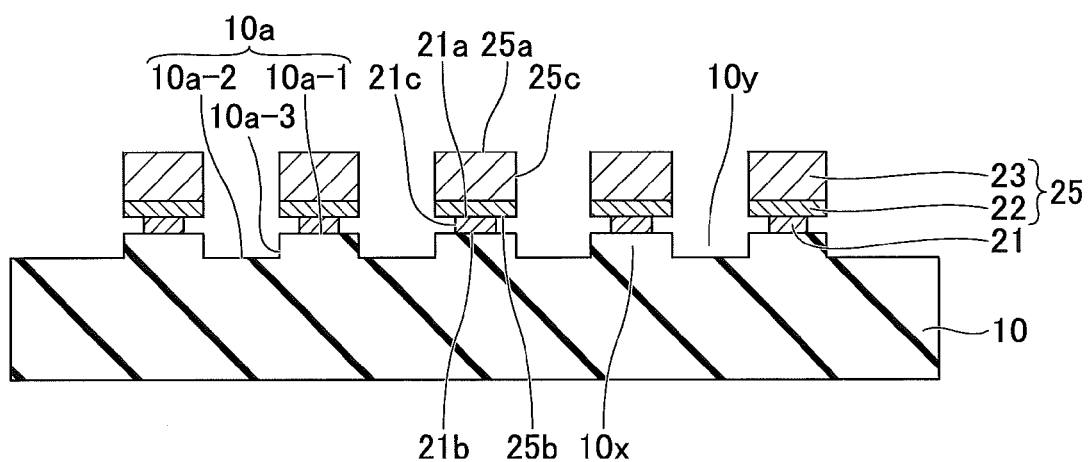
FIG. 4 is a diagram depicting a process of manufacturing a wiring substrate according to the first variation of the first embodiment.

To form the wiring substrate 1A, the process depicted in FIG. 4 may be performed after performing the process of FIGS. 2A through 2E of the first embodiment.

In the process depicted in FIG. 4, a peripheral portion of the metal film 21 is removed to make the width of the metal film 21 smaller than the width of the upper end face 10a-1 of the projection 10x and the width of the metal layer 25. As a result, a peripheral portion of the lower surface 25b of the metal layer 25 (a peripheral portion of the lower surface of the metal film 22) is exposed outside the upper surface 21a of the metal film 21. Furthermore, a peripheral portion of the upper end face 10a-1 of the projection 10x is exposed outside the metal film 21. When the metal layer 25 is formed of copper, the metal film 21 of titanium may be selectively removed with respect to the metal layer 25 by, for example, wet etching, using an alkali aqueous solution of oxidizing liquid.

Thereafter, the process of FIGS. 2F through 2I is performed to complete the wiring substrate 1A (FIGS. 3A and 3B).

Thus, according to the wiring substrate 1A, the bottom surface 10a-2 and the inner wall surfaces 10a-3 of the depression 10y of the insulating layer 10 are roughened surfaces the same as in the wiring substrate 1. This increases the adhesion between the insulating layer 10 and the insulating layer 30. Therefore, the metal layer 25 is prevented from depositing at the interface between the insulating layer 10 and the insulating layer 30 to increase insulation reliability. The increase of insulation reliability is also described with reference to Example 2 described below.

Furthermore, according to the wiring substrate 1A, the width W1 of the upper end face 10a-1 of the projection 10x is greater than the width W3 of the metal film 21. As a result, the distance from the wiring layer 20 (the metal layer 25 in particular) to the interface between the insulating layer 10 and the insulating layer 30 increases, thus producing the effect that dendrites or the like are less likely to be generated at the interface between the insulating layer 10 and the insulating layer 30. Furthermore, the area of roughened surfaces increases to increase the adhesion between the insulating layer 10 and the insulating layer 30, thus producing the effect that dendrites or the like are even less likely to be generated. Because it is possible to reduce generation of dendrites that cause ion migration, it is possible to prevent the occurrence of ion migration.

Whether to increase the distance between the inner wall surfaces 10a-3 of the depression 10y on the metal film 21 side may be determined as desired by changing etching conditions. Therefore, the distance between the inner wall surfaces 10a-3 of the depression 10y on the metal film 21 side may be increased the same as in the wiring substrate 1.

Second Variation of First Embodiment

A second variation of the first embodiment is directed to another fine-line wiring layer different in structure than in the first embodiment. In the description of the second variation of the first embodiment, a description of the same elements as those of the above-described embodiment may be omitted.

Figure 5A:
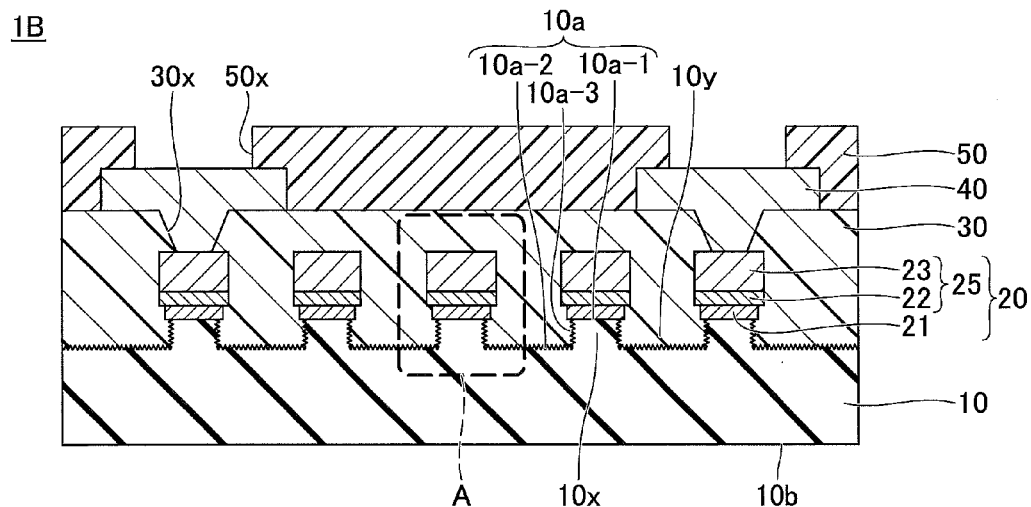
FIGS. 5A and 5B are cross-sectional views of a wiring substrate according to a second variation of the first embodiment.
Figure 5B:
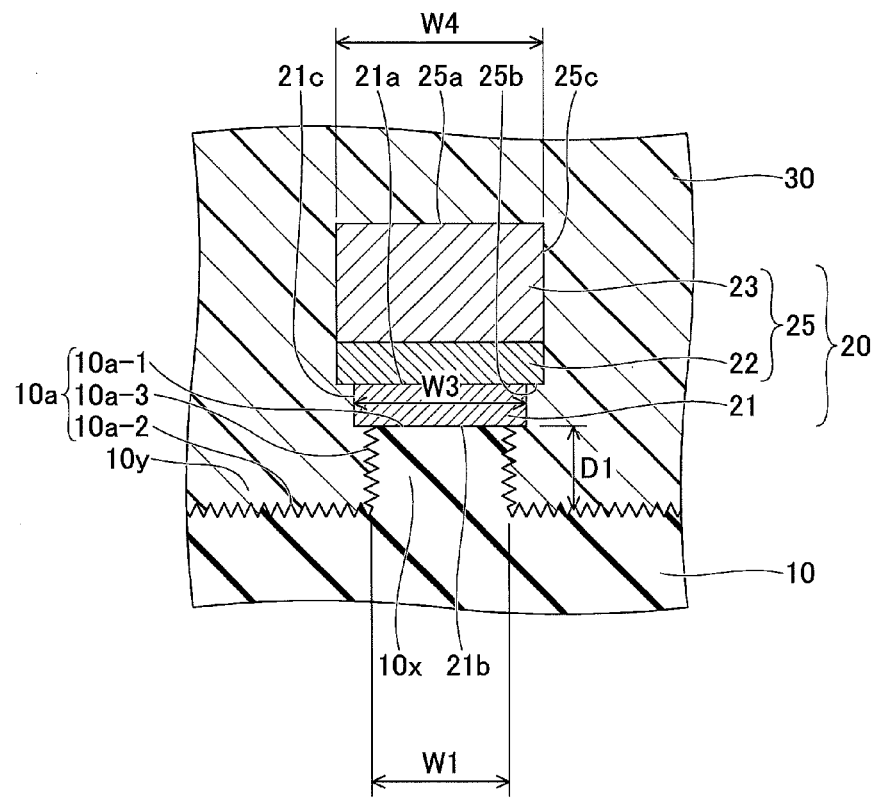

FIG. 5A is a cross-sectional view of part of a wiring substrate in which wiring layers and insulating layers are alternately stacked according to the second variation of the first embodiment. FIG. 5B is an enlarged view of part A indicated by the dashed line in FIG. 5A.

Referring to FIGS. 5A and 5B, a wiring substrate 1B is equal to the wiring substrate 1 in that the bottom surface 10a-2 and the inner wall surfaces 10a-3 of the depression 10y are roughened surfaces, but is different from the wiring substrate 1 in that there is no increase in the distance between the inner wall surfaces 10a-3 of the depression 10y. In other words, the width W1 of the projection 10x surrounded by the depression 10y is substantially constant, and is substantially equal to the width of the upper end face 10a-1 of the projection 10x. The width W1 of the projection 10x surrounded by the depression 10y (the width of the upper end face 10a-1 of the projection 10x) may be, for example, approximately 2 μm to approximately 5 μm.

The upper end face 10a-1 of the projection 10x contacting the metal film 21 is a smooth surface having a smaller roughness than the bottom surface 10a-2 and the inner wall surfaces 10a-3 of the depression 10y. The metal film 21 includes the upper surface 21a, the lower surface 21b, and the side surfaces 21c. The metal film 21 is formed to expose a peripheral portion of the lower surface 21b outside the upper end face 10a-1 of the projection 10x. The width W3 of the metal film 21 is greater than the width W1 of the upper end face 10a-1 by, for example, approximately 0.1 μm to approximately 0.3 μm.

The metal layer 25 is stacked on the upper surface 21a of the metal film 21. Specifically, the metal layer 25 includes the metal film 22 and the metal film 23. The metal film 22 is formed on the upper surface 21a of the metal film 21 with a peripheral portion of the lower surface of the metal film 22 being exposed (not covered with the metal film 21) outside the upper surface 21a of the metal film 21. The metal film 23 is stacked on the metal film 22.

The metal layer 25 includes the upper surface 25a, the lower surface 25b, and the side surfaces 25c. The metal layer 25 is formed on the metal film 21 with a peripheral portion of the lower surface 25b (the peripheral portion of the lower surface of the metal film 22) being exposed (not covered with the metal film 21) outside the upper surface 21a of the metal film 21. The width W4 of the metal layer 25 is greater than the width W3 of the metal film 21. Specifically, the width W4 of the metal layer 25 is greater than the width W3 of the metal film 21 by, for example, approximately 0.1 μm to approximately 0.3 μm. Furthermore, the width W4 of the metal layer 25 is greater than the width W1 of the upper end face 10a-1 of the projection 10x. Specifically, the width W4 of the metal layer 25 is greater than the width W3 of the upper end face 10a-1 by, for example, approximately 0.2 μm to approximately 0.6 μm.

To form the wiring substrate 1B, the process depicted in FIG. 4 is performed after performing the process of FIGS. 2A through 2E of the first embodiment. Then, the process of FIG. 2F may be performed to etch the insulating layer 10 to expose the peripheral portion of the lower surface 21b of the metal film 21 outside the upper end face 10a-1. Thereafter, the process of FIGS. 2G through 2I of the first embodiment is performed to complete the wiring substrate 1B (FIGS. 5A and 5B).

Thus, according to the wiring substrate 1B, the bottom surface 10a-2 and the inner wall surfaces 10a-3 of the depression 10y of the insulating layer 10 are roughened surfaces the same as in the wiring substrate 1. This increases the adhesion between the insulating layer 10 and the insulating layer 30. Therefore, the metal layer 25 is prevented from depositing at the interface between the insulating layer 10 and the insulating layer 30 to increase insulation reliability. The increase of insulation reliability is also described with reference to Example 3 described below.

Furthermore, according to the wiring substrate 1B, the width W1 of the upper end face 10a-1 of the projection 10x is smaller than the width W3 of the metal film 21. Furthermore, the width W3 of the metal film 21 is smaller than the width W4 of the metal layer 25. As a result, the distance from the wiring layer 20 (the metal layer 25 in particular) to the interface between the insulating layer 10 and the insulating layer 30 increases, thus producing the effect that dendrites or the like are less likely to be generated at the interface between the insulating layer 10 and the insulating layer 30. Because it is possible to reduce generation of dendrites that cause ion migration, it is possible to prevent the occurrence of ion migration.

Whether to increase the distance between the inner wall surfaces 10a-3 of the depression 10y on the metal film 21 side may be determined as desired by changing etching conditions. Therefore, the distance between the inner wall surfaces 10a-3 of the depression 10y on the metal film 21 side may be increased the same as in the wiring substrate 1.

[b] Second Embodiment

A second embodiment is directed to the case of forming protrusions in roughened surfaces of a depression of an insulating layer. In the description of the second embodiment, a description of the same elements as those of the above-described embodiment may be omitted.

Figure 6A:
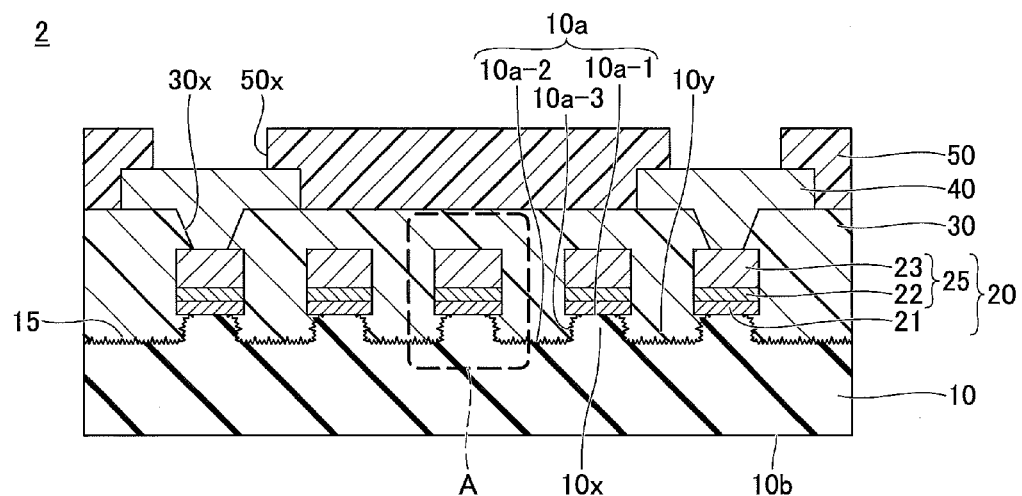
FIGS. 6A and 6B are cross-sectional views of a wiring substrate according to a second embodiment.
Figure 6B:
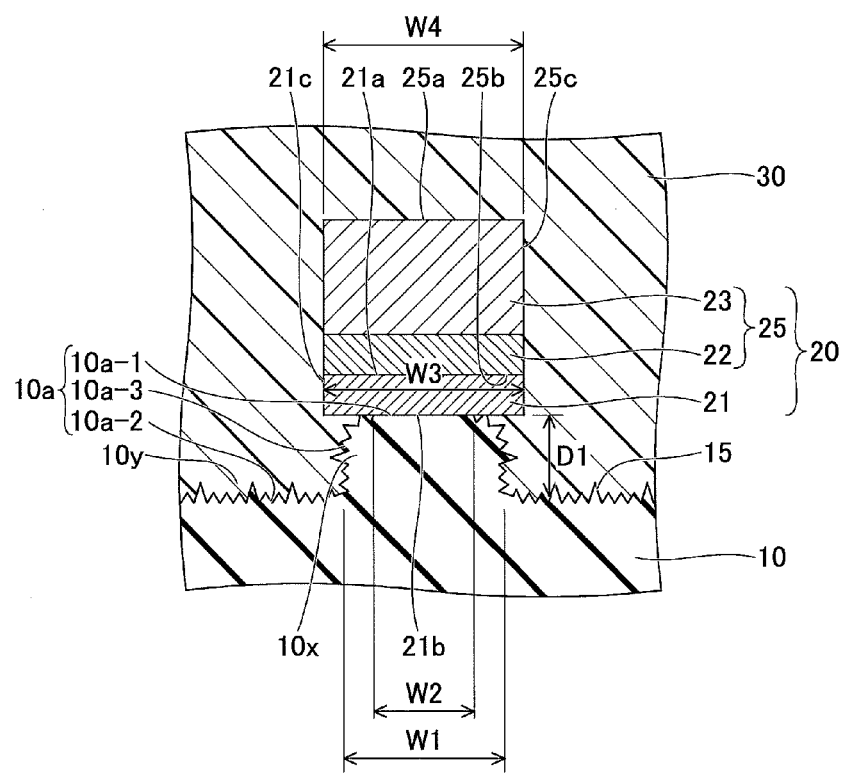

FIG. 6A is a cross-sectional view of part of a wiring substrate in which wiring layers and insulating layers are alternately stacked according to the second embodiment. FIG. 6B is an enlarged view of part A indicated by the dashed line in FIG. 6A.

Referring to FIGS. 6A and 6B, according to a wiring substrate 2, the bottom surface 10a-2 and the inner wall surfaces 10a-3 of the depression 10y are roughened surfaces having a greater surface roughness than the upper end face 10a-1 of the projection 10x the same as in the wiring substrate 1, but in addition, one or more protrusions 15 (hereinafter collectively referred to as "protrusion 15") are formed in the roughened surfaces. The principal component of the protrusion 15 is a silicon oxide such as SiO, $SiO_2$, or SiOx.

Figure 7A:
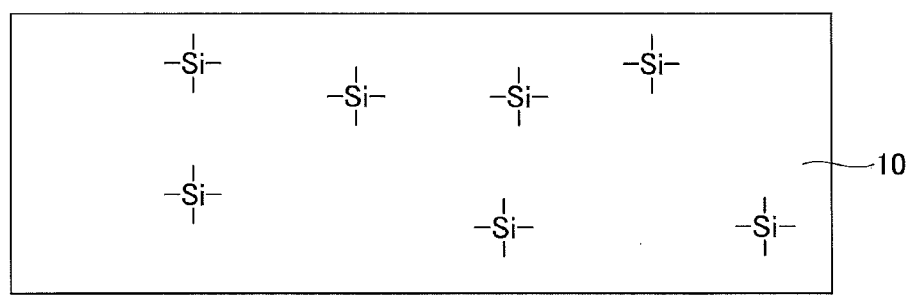
FIGS. 7A and 7B are diagrams illustrating the formation of a projection.

To form the wiring substrate 2, an insulating resin formed of an organic compound including elements of silicon (Si), carbon (C), hydrogen (H), and oxygen (O) is prepared as the insulating layer 10 as depicted in FIG. 7A. The elements of silicon (Si), carbon (C), hydrogen (H), and oxygen (O) are bonded to one another to have a polymer structure. Then, using the prepared insulating layer 10, the process of FIGS. 2A through 2E of the first embodiment is performed.

Next, in the process depicted in FIG. 2F, as isotropic etching, plasma processing using a gas containing oxygen gas is performed. The plasma processing may be performed using oxygen gas alone or a gas mixture containing oxygen gas and another gas (such as nitrogen gas).

Figure 7B:
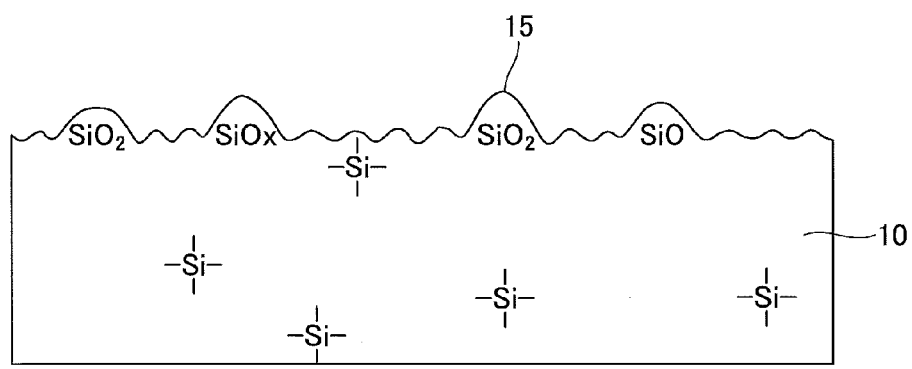

Plasma processing is performed on the surface of the insulating layer 10 (the bottom surface 10a-2 and the inner wall surfaces 10a-3 of the depression 10y), using a gas containing oxygen gas. As a result, as depicted in FIG. 7B, the surface of the insulating layer 10 (the bottom surface 10a-2 and the inner wall surfaces 10a-3 of the depression 10y) becomes a roughened surface, and is modified into a silicon oxide (such as SiO, $SiO_2$, or SiOx) rich molecular structure. Accordingly, the protrusion 15 including a silicon oxide (such as SiO, $SiO_2$, or SiOx) as a principal component is formed in the roughened surface. In FIGS. 7A and 7B, for simplification, the shape of the depression 10y is not graphically represented.

Thus, by performing plasma processing on the bottom surface 10a-2 and the inner wall surfaces 10a-3 of the depression 10y of the insulating layer 10, it is possible to roughen the bottom surface 10a-2 and the inner wall surfaces 10a-3 of the depression 10y, and at the same time, to modify the roughened surfaces of the bottom surface 10a-2 and the inner wall surfaces 10a-3 of the depression 10y to include the protrusion 15 containing a silicon oxide (such as SiO, $SiO_2$, or SiOx) as a principal component. As a result, the adhesion between the insulating layer 10 and the insulating layer 30 increases to prevent the metal layer 25 from depositing at the interface between the insulating layer 10 and the insulating layer 30, thus increasing insulation reliability. The increase of insulation reliability is also described with reference to Example 4 described below.

Example 1

Five samples of the wiring substrate 1 depicted in FIGS. 1A and 1B were manufactured, and a voltage of 3.5 V was applied between adjacent wiring patterns of the wiring layer 20 to conduct a highly accelerated temperature and humidity stress test (HAST). The HAST test is an environmental test standardized by IEC 60068-2-66. Copper was used as the metal layer 25, and the line/space of the wiring layer 20 was 2 μm/2 μm.

Figure 8:
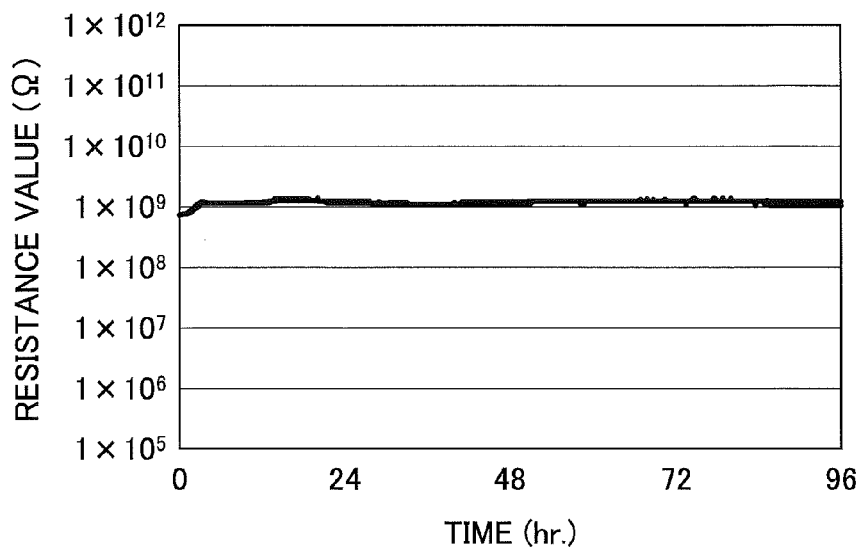
FIG. 8 is a graph presenting the HAST test results of Example 1.

After 96-hour testing, no deposition of copper was observed between the adjacent wiring patterns of the wiring layer 20 in any of the samples. Furthermore, in each of the samples, the resistance value against testing time was $1\times10^5 \Omega$ or higher as presented in FIG. 8, and no decrease in insulation reliability (no decrease in resistance value) was observed. There is a problem in insulation reliability when the resistance value is below $1\times10^5 \Omega$.

Example 2

Five samples of the wiring substrate 1A depicted in FIGS. 3A and 3B were manufactured, and a voltage of 3.5 V was applied between adjacent wiring patterns of the wiring layer 20 to conduct a HAST test. Copper was used as the metal layer 25, and the line/space of the wiring layer 20 was 2 μm/2 μm.

Figure 9:
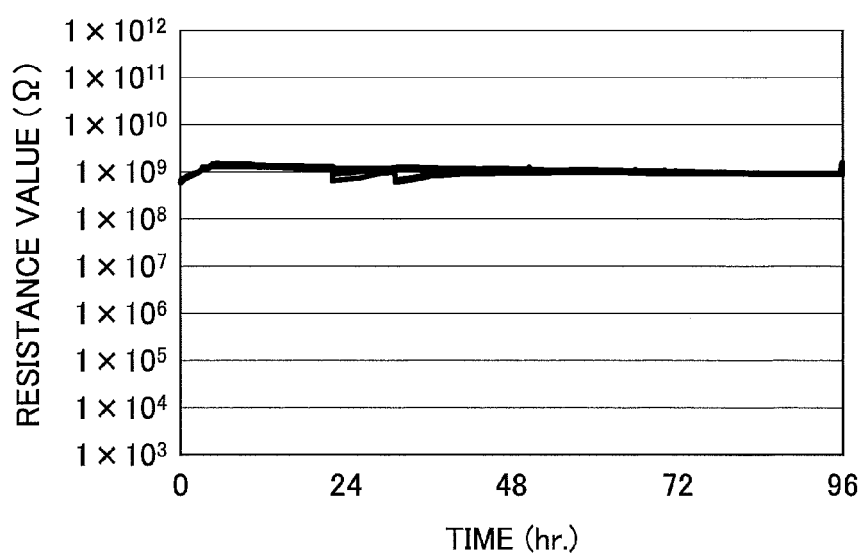
FIG. 9 is a graph presenting the HAST test results of Example 2.

After 96-hour testing, no deposition of copper was observed between the adjacent wiring patterns of the wiring layer 20 in any of the samples. Furthermore, in each of the samples, the resistance value against testing time was $1\times10^5 \Omega$ or higher as presented in FIG. 9, and no decrease in insulation reliability (no decrease in resistance value) was observed.

Example 3

Five samples of the wiring substrate 1B depicted in FIGS. 5A and 5B were manufactured, and a voltage of 3.5 V was applied between adjacent wiring patterns of the wiring layer 20 to conduct a HAST test. Copper was used as the metal layer 25, and the line/space of the wiring layer 20 was 2 μm/2 μm.

Figure 10:
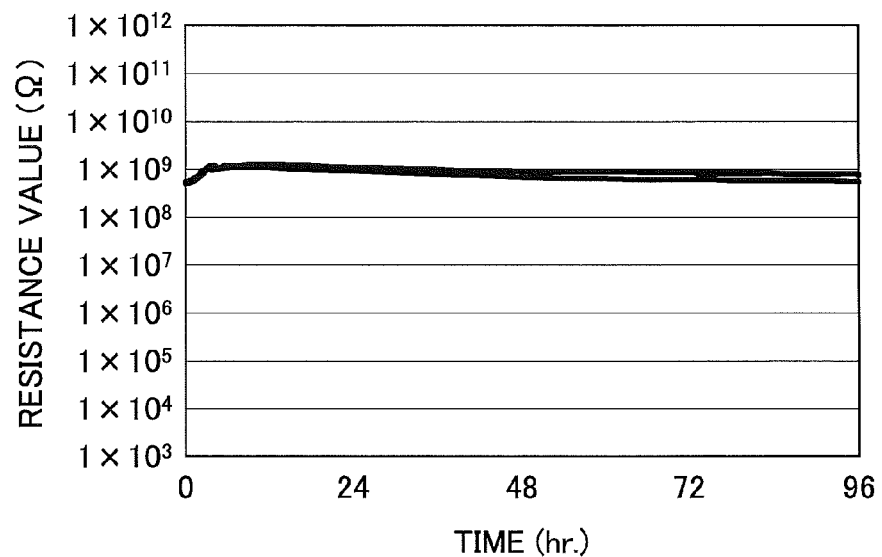
FIG. 10 is a graph presenting the HAST test results of Example 3.

After 96-hour testing, no deposition of copper was observed between the adjacent wiring patterns of the wiring layer 20 in any of the samples. Furthermore, in each of the samples, the resistance value against testing time was $1\times10^5 \Omega$ or higher as presented in FIG. 10, and no decrease in insulation reliability (no decrease in resistance value) was observed.

Comparative Example

Five sample wiring substrates, each being the same as the wiring substrate 1A depicted in FIGS. 3A and 3B except that the bottom surface 10a-2 alone was roughened and the inner wall surfaces 10a-3 were not roughened in the depression 10y, were manufactured, and a voltage was applied between adjacent wiring patterns of the wiring layer 20 to conduct a HAST test. Copper was used as the metal layer 25, and the line/space of the wiring layer 20 was 2 μm/2 μm.

Figure 11:
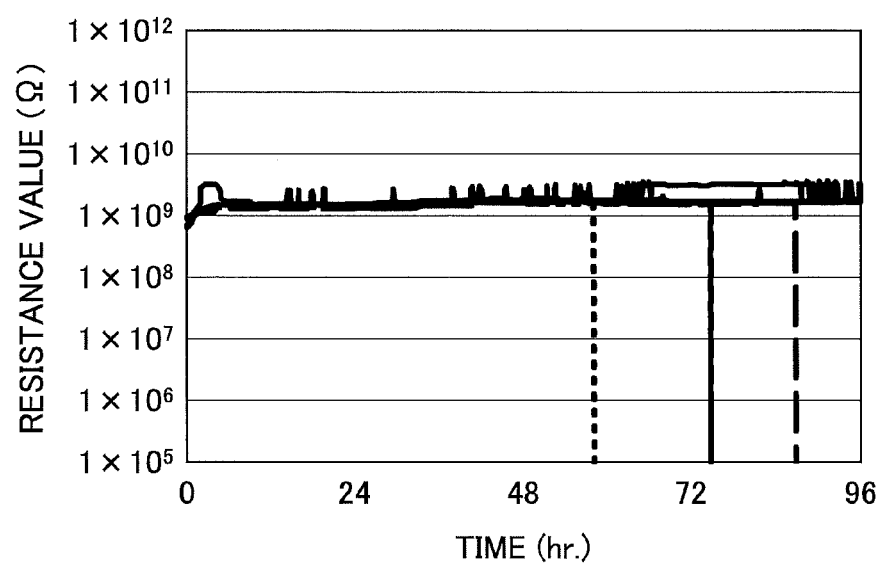
FIG. 11 is a graph presenting the HAST test results of Comparative Example.

After 96-hour testing, the deposition of copper was observed between the adjacent wiring patterns of the wiring layer 20 in three of the five samples. Furthermore, in three of the five samples, the resistance value against testing time was below $1\times10^5 \Omega$ as presented in FIG. 11, and a decrease in insulation reliability (a decrease in resistance value) was observed.

Summary of Examples 1-3 and Comparative Example

The test results of Comparative Example indicate that roughening the bottom surface 10a-2 of the depression 10y alone does not sufficiently increase insulation reliability. This is believed to be because the insufficient adhesion between the smooth inner wall surfaces of the depression 10y and the insulating layer 30 caused the deposition of the metal layer 25 at the interface between the inner wall surfaces of the depression 10y and the insulating layer 30 to reduce the resistance value between the wiring patterns of the wiring layer 20.

In contrast, the test results of Examples 1-3 have confirmed the effect of roughening the bottom surface 10a-2 and the inner wall surfaces 10a-3 of the depression 10y in any of the structures of the wiring substrates 1, 1A, and 1B. That is, it has been confirmed that roughening the bottom surface 10a-2 and the inner wall surfaces 10a-3 of the depression 10y increases the adhesion between the insulating layer 10 and the insulating layer 30 to prevent the deposition of the metal layer 25 at the interface between the insulating layer 10 and the insulating layer 30, thus increasing insulation reliability.

Example 4

Five samples of the wiring substrate 2 depicted in FIGS. 6A and 6B were manufactured, and a voltage of 3.5 V was applied between adjacent wiring patterns of the wiring layer 20 to conduct a HAST test. Copper was used as the metal layer 25, and the line/space of the wiring layer 20 was 2 μm/2 μm.

Figure 12:
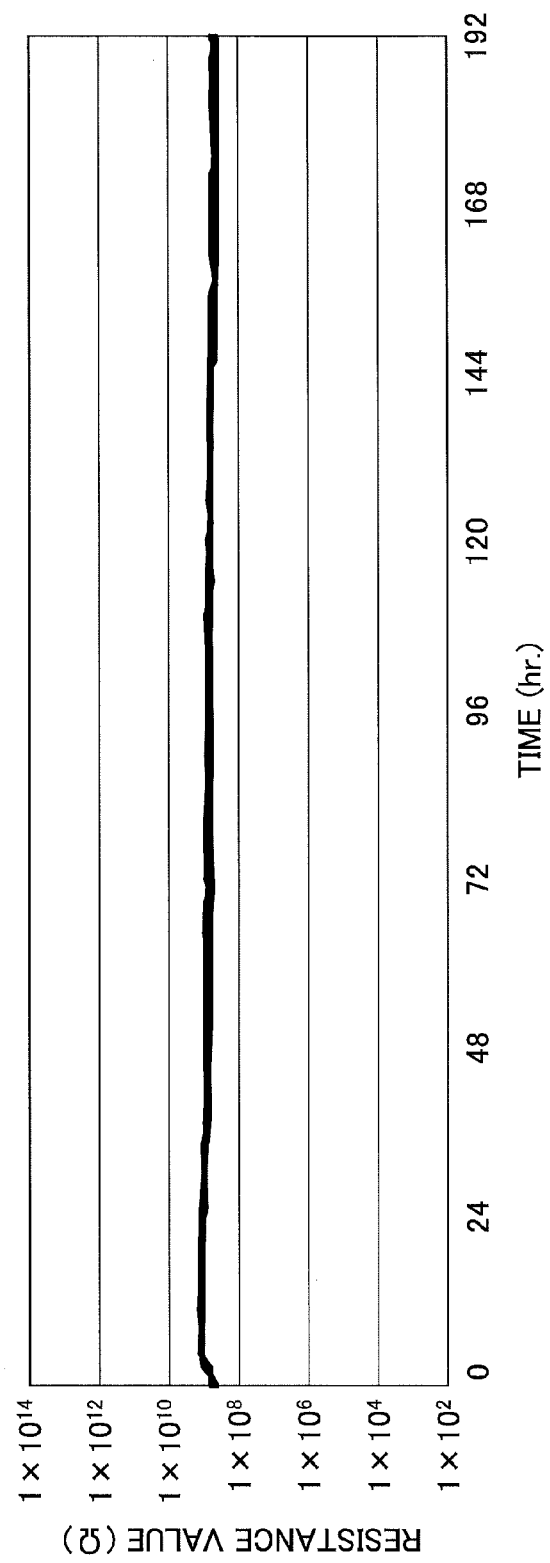
FIG. 12 is a graph presenting the HAST test results of Example 4.

After 192-hour testing, no deposition of copper was observed between the adjacent wiring patterns of the wiring layer 20 in any of the samples. Furthermore, in each of the samples, the resistance value against testing time was $1\times10^5 \Omega$ or higher as presented in FIG. 12, and no decrease in insulation reliability (no decrease in resistance value) was observed.

Furthermore, with respect to the samples of Example 4 and the samples of Comparative Example, the condition of the surface (the bottom surface and inner wall surfaces of the depression 10y) of the insulating layer 10 was subjected to an X-ray photoelectron spectroscopy (XPS) analysis. The XPS analysis is a technique to analyze the composition and the binding state of elements constituting the surface of a sample by exposing the surface of the sample to X-rays and measuring the kinetic energy of photoelectrons emitted from the surface of the sample. The time of plasma processing in the samples of Example 4 was approximately 180 seconds.

Figure 13B:
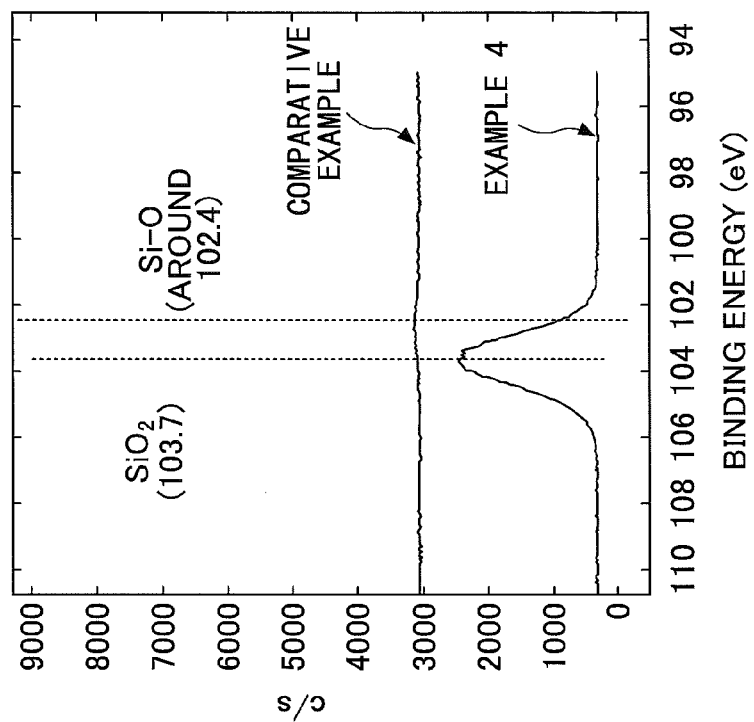
FIGS. 13A and 13B are diagrams presenting the XPS analysis results of Example 4 and Comparative Example.
Figure 13A:
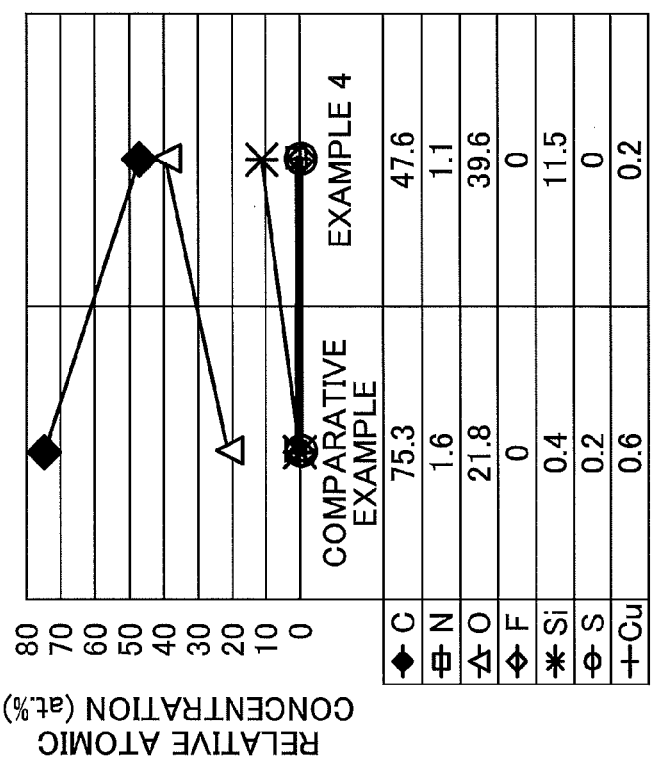

The results of the XPS analysis indicate that, as presented in FIG. 13A, the detected amount of silicon (Si) and the detected amount of oxygen (O) are greater in the samples of Example 4 than in the samples of Comparative Example by approximately 10 points (from 0.4 at. % to 11.5 at. %) and approximately 20 points (from 21.8 at. % to 39.6 at. %), respectively, while the detected amount of carbon (C) is smaller in the samples of Example 4 than in the samples of Comparative Example by approximately 30 points (from 75.3 at. % to 47.6 at. %).

Furthermore, as presented in FIG. 13B, the Si2p spectrum of the samples of Example 4 has a top peak at 103.7 eV, indicating the presence of $SiO_2$ in a bonded state at the surface of the insulating layer 10.

Thus, it has been confirmed in the samples of Example 4 that by performing plasma processing on the bottom surface 10a-2 and the inner wall surfaces 10a-3 of the depression 10y of the insulating layer 10, the roughened surfaces of the bottom surface 10a-2 and the inner wall surfaces 10a-3 of the depression 10y are modified to form the protrusion 15 whose principal component is a silicon oxide (such as SiO, $SiO_2$, or SiOx).

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, two or more of the embodiments and variations may be suitably combined.

Various aspects of the subject-matter described herein may be set out non-exhaustively in the following numbered clauses:

1. A method of manufacturing a wiring substrate, including:
    forming a first metal layer on an insulating layer;
    selectively forming a second metal layer on the first metal layer;
    removing the first metal layer exposed through the second metal layer and digging into a surface of the insulating layer exposed by removing the first metal layer to form a projection in the insulating layer and a laminate of the first metal layer and the second metal layer on the projection; and
    roughening a bottom surface and an inner wall surface of a depression formed around the projection,
    wherein a width of an end face of the projection on which the first metal layer is formed is different from at least one of a width of the first metal layer and a width of the second metal layer.

2. The method of clause 1, further including:
    removing a peripheral portion of the first metal layer to make the width of the first metal layer smaller than the width of the second metal layer to expose a peripheral portion of a surface of the second metal layer facing the first metal layer outside the first metal layer.

3. The method of clause 1, wherein
    the insulating layer is formed of an insulating resin, the insulating resin being formed of an organic compound including elements of silicon (Si), carbon (C), hydrogen (H), and oxygen (O), and
    in roughening the bottom surface and the inner wall surface of the depression, plasma processing is performed to roughen the bottom surface and the inner wall surface of the depression and form a protrusion whose principal component is a silicon oxide in the roughened inner wall surface and the roughened bottom surface of the depression.

4. The method of clause 1, further including:
    forming another insulating layer on the insulating layer, the other insulating layer including a photosensitive resin as a principal component, the other insulating layer covering the wiring layer and filling in the depression.

What is claimed is:
1. A wiring substrate, comprising:
    an insulating layer including a projection; and
    a wiring layer on the projection,
    the wiring layer including
        a first metal layer on an end face of the projection; and
        a second metal layer on the first metal layer,
    wherein a width of the end face of the projection is smaller than a width of the first metal layer and a width of the second metal layer, and
    an inner wall surface and a bottom surface of a depression around the projection are roughened surfaces.

2. The wiring substrate as claimed in claim 1, wherein a roughness of the end face of the projection in contact with the first metal layer is smaller than a roughness of the inner wall surface and the bottom surface of the depression.

3. The wiring substrate as claimed in claim 1, further comprising:
    another insulating layer on the insulating layer, the another insulating layer including a photosensitive resin as a principal component, the another insulating layer covering the wiring layer, and the inner wall surface and the bottom surface of the depression.

4. The wiring substrate as claimed in claim 1, wherein
    the insulating layer is formed of an insulating resin, the insulating resin being formed of an organic compound including elements of silicon (Si), carbon (C), hydrogen (H), and oxygen (O), and
    a protrusion whose principal component is a silicon oxide is formed in the inner wall surface and the bottom surface of the depression that are the roughened surfaces.

5. A wiring substrate, comprising:
    an insulating layer including a projection; and
    a wiring layer on the projection,
    the wiring layer including
        a first metal layer on an end face of the projection; and
        a second metal layer on the first metal layer,
    wherein a width of the end face of the projection is different from at least one of a width of the first metal layer and a width of the second metal layer,
    an inner wall surface and a bottom surface of a depression around the projection are roughened surfaces,
    the width of the first metal layer is smaller than the width of the second metal layer, and
    the second metal layer includes a surface in contact with the first metal layer, and a peripheral portion of the surface of the second metal layer is exposed outside the first metal layer.

6. The wiring substrate as claimed in claim 5, wherein a roughness of the end face of the projection in contact with the first metal layer is smaller than a roughness of the inner wall surface and the bottom surface of the depression.

7. The wiring substrate as claimed in claim 5, wherein
    the width of the first metal layer is smaller than the width of the end face of the projection, and
    a peripheral portion of the end face of the projection is exposed outside the first metal layer.

8. The wiring substrate as claimed in claim 5, further comprising:
    another insulating layer on the insulating layer, the another insulating layer including a photosensitive resin as a principal component, the another insulating layer covering the wiring layer, and the inner wall surface and the bottom surface of the depression.

9. The wiring substrate as claimed in claim 5, wherein
    the insulating layer is formed of an insulating resin, the insulating resin being formed of an organic compound including elements of silicon (Si), carbon (C), hydrogen (H), and oxygen (O), and
    a protrusion whose principal component is a silicon oxide is formed in the inner wall surface and the bottom surface of the depression that are the roughened surfaces.

* * * * *